United States Patent [19]

Ohsawa et al.

[11] Patent Number: 5,210,433
[45] Date of Patent: May 11, 1993

[54] SOLID-STATE CCD IMAGING DEVICE WITH TRANSFER GAP VOLTAGE CONTROLLER

[75] Inventors: Shinji Ohsawa, Tokyo; Yoshiyuki Matsunaga, Kamakura; Ryohei Miyagawa, Yokohama, all of Japan

[73] Assignee: Kabushiki Kaisha Toshiba, Kawasaki, Japan

[21] Appl. No.: 962,003

[22] Filed: Oct. 15, 1992

Related U.S. Application Data

[63] Continuation of Ser. No. 660,931, Feb. 26, 1991, abandoned.

[30] Foreign Application Priority Data

| Feb. 26, 1990 | [JP] | Japan | 2-44796 |
| Feb. 26, 1990 | [JP] | Japan | 2-44797 |
| Jul. 5, 1990 | [JP] | Japan | 2-176393 |

[51] Int. Cl.$^5$ .............. H01L 29/78; H01L 27/14; H01L 31/00
[52] U.S. Cl. .................. 257/250; 257/223; 257/229; 257/232; 257/233
[58] Field of Search ............ 357/24 LR; 257/222, 257/223, 229, 232, 233, 249, 250; 377/61, 62, 63; 358/213.22, 213.27, 213.29, 213.23

[56] References Cited

U.S. PATENT DOCUMENTS

| 4,489,423 | 12/1984 | Suzuki | 357/24 LR |
| 4,696,021 | 9/1987 | Kawahara et al. | 357/24 LR |
| 4,709,380 | 11/1987 | Itoh | 357/24 |
| 4,729,005 | 3/1988 | Wei et al. | 357/24 |
| 4,774,586 | 9/1988 | Koike et al. | 357/24 LR |
| 4,914,493 | 4/1990 | Shiromizu | 357/24 LR |

FOREIGN PATENT DOCUMENTS

| 57-10278 | 1/1982 | Japan | 357/24 LR |
| 57-109476 | 7/1982 | Japan | 357/24 LR |

*Primary Examiner*—William D. Larkins
*Assistant Examiner*—Ngan Van Ngo
*Attorney, Agent, or Firm*—Oblon, Spivak, McClelland, Maier & Neustadt

[57] ABSTRACT

A solid-state CCD imaging device has a substrate, photosensitive pixel cells provided as pixel sections in the substrate, and a transfer section, provided in the substrate, for transferring signal charge carriers read out from the pixel cells in a predetermined transfer direction. The transfer section has a semiconductive charge transfer channel layer formed in the substrate and transfer electrodes insulatively provided above the substrate and arrayed in the above direction while predetermined gap sections are kept therebetween. Each of the transfer electrodes defines one charge transfer stage. A gap potential control electrode layer is insulatively disposed above the electrodes. The gap potential control electrode layer is applied with a gap potential control voltage and steadily sets, in accordance with the applied voltage, the potential in layer sections of the channel layer located below the gap section of the transfer electrodes at a predetermined level intermediate between "High" and "Low" level voltages of the channel layers upon charge transfer.

22 Claims, 17 Drawing Sheets

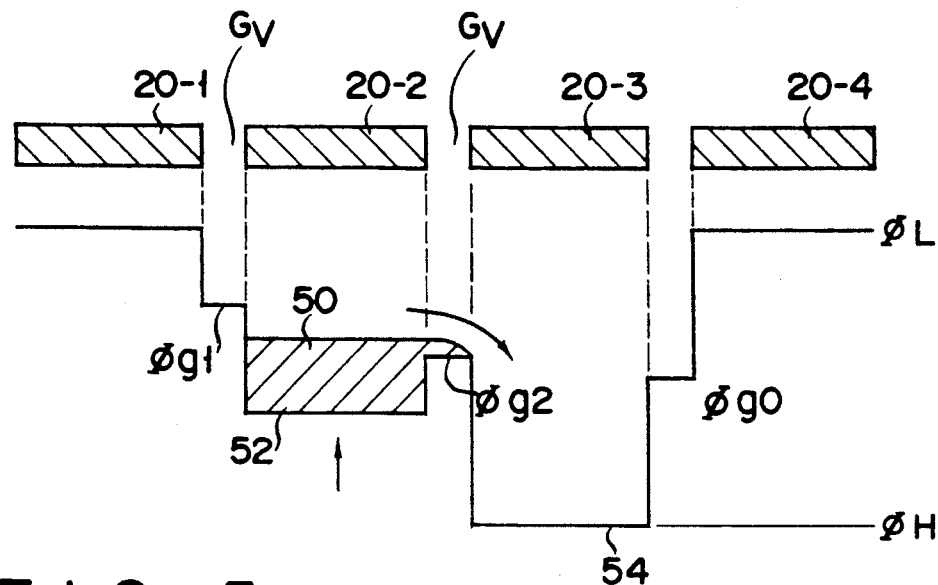
F I G. 5
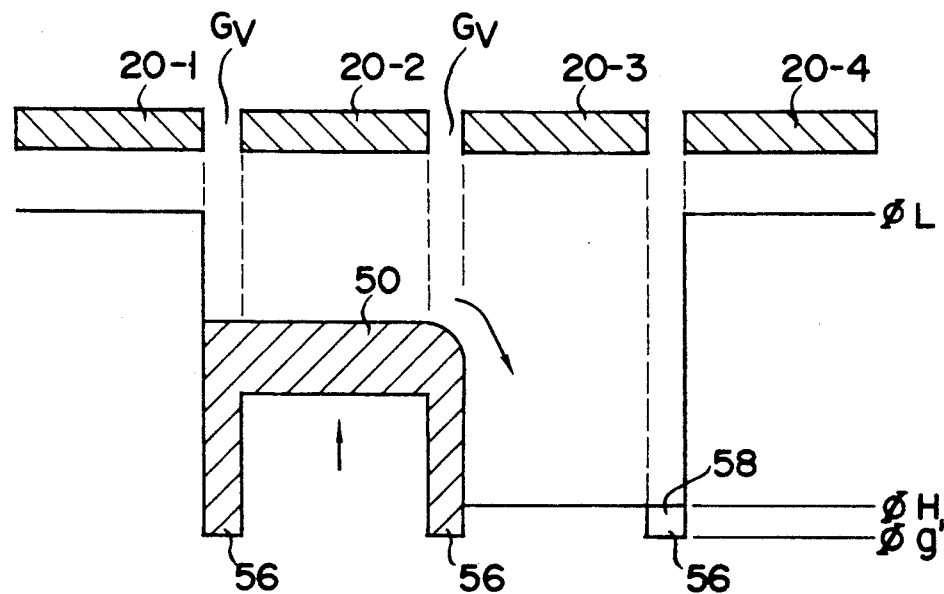
F I G. 6

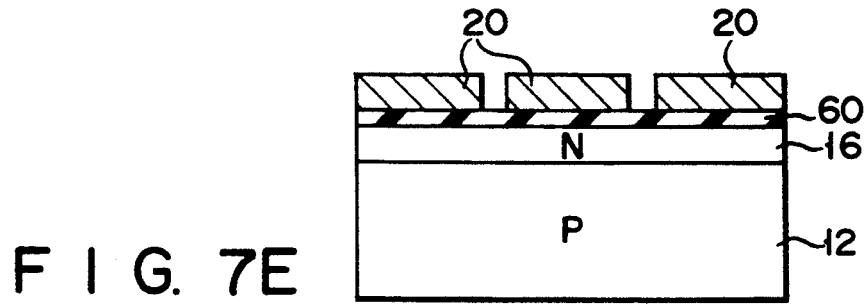
F I G. 7E
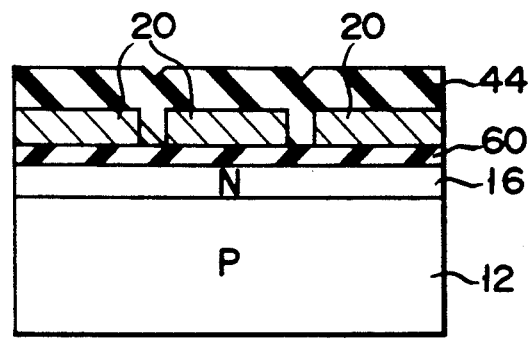
F I G. 7F
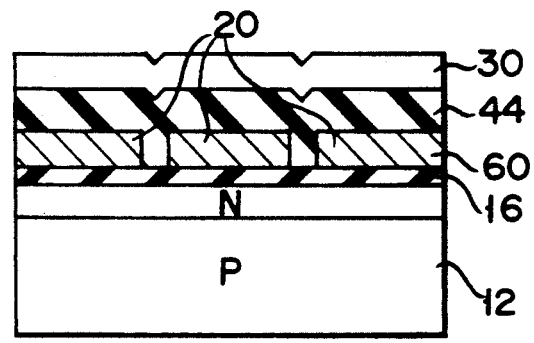
F I G. 7G

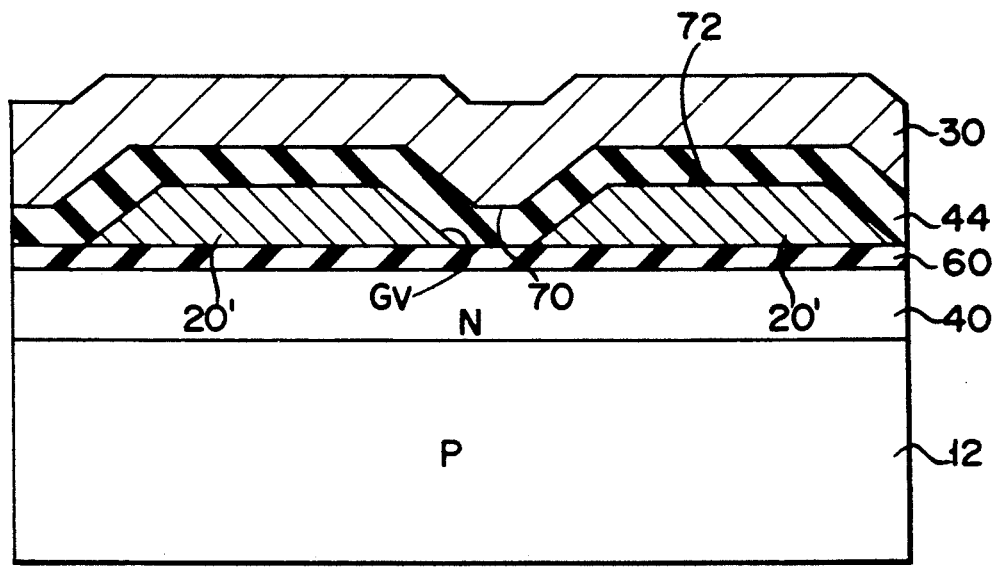
F I G. 10
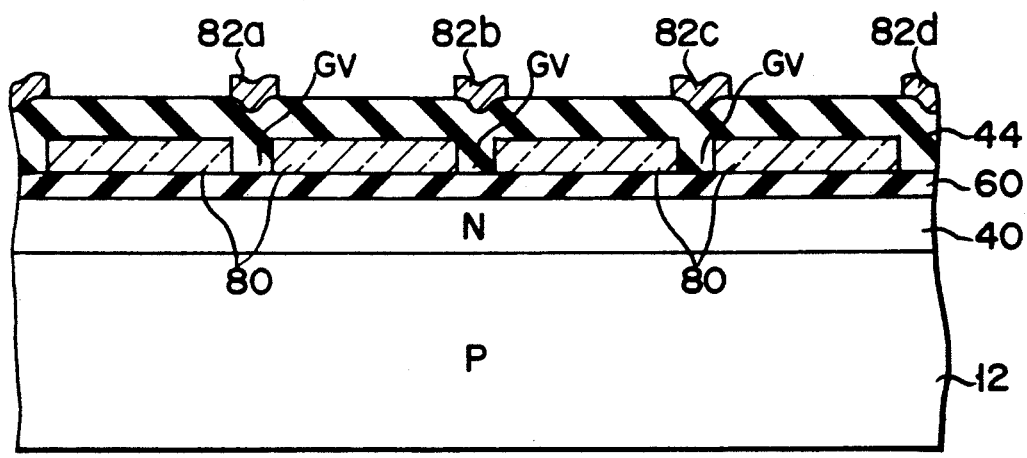
F I G. 11

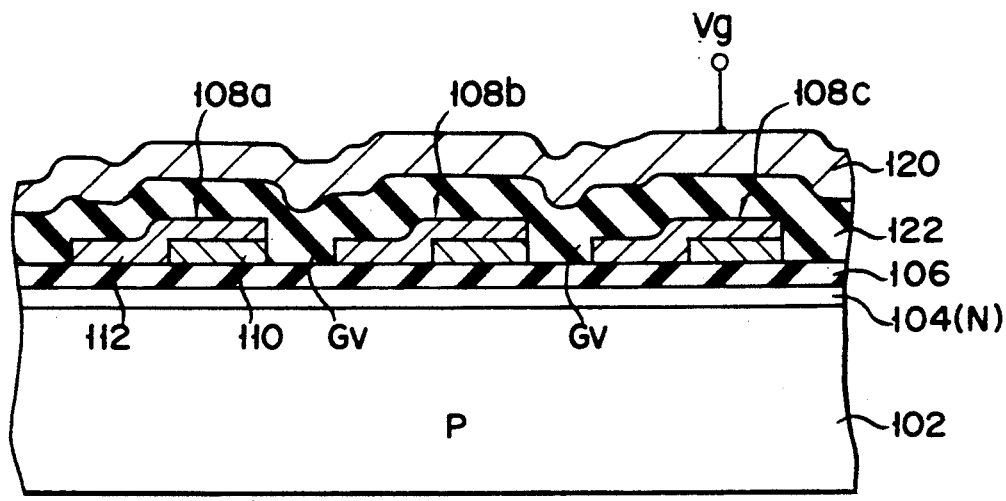
FIG. 13
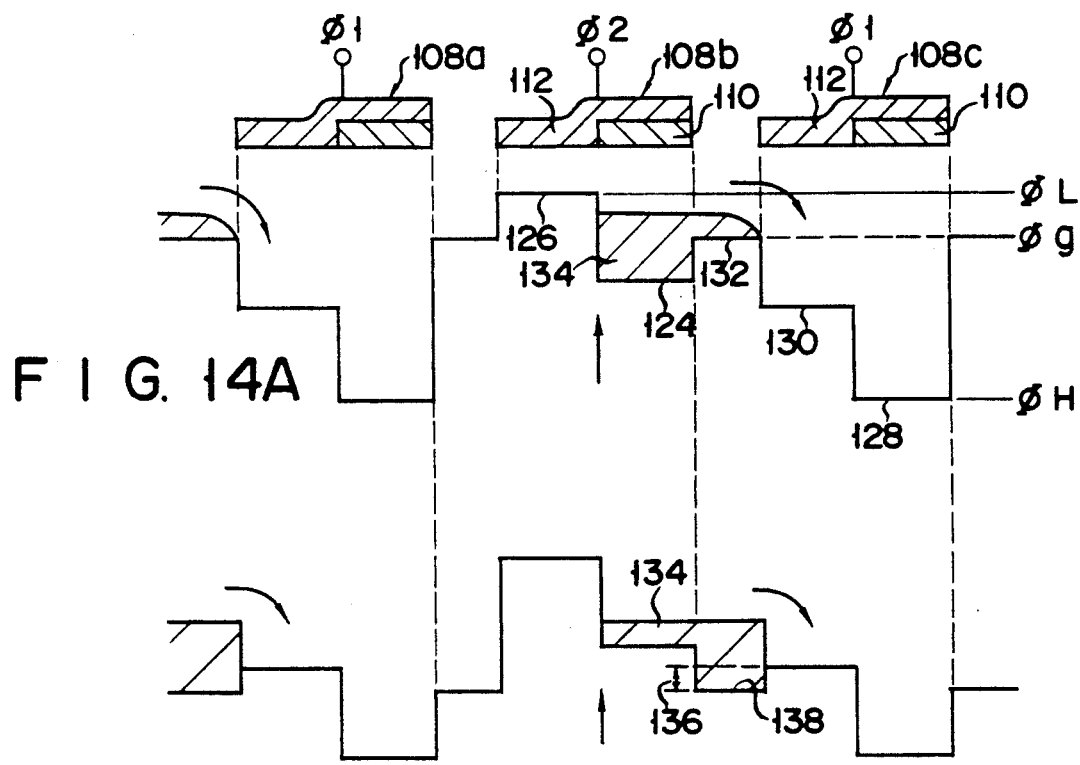
FIG. 14A
FIG. 14B

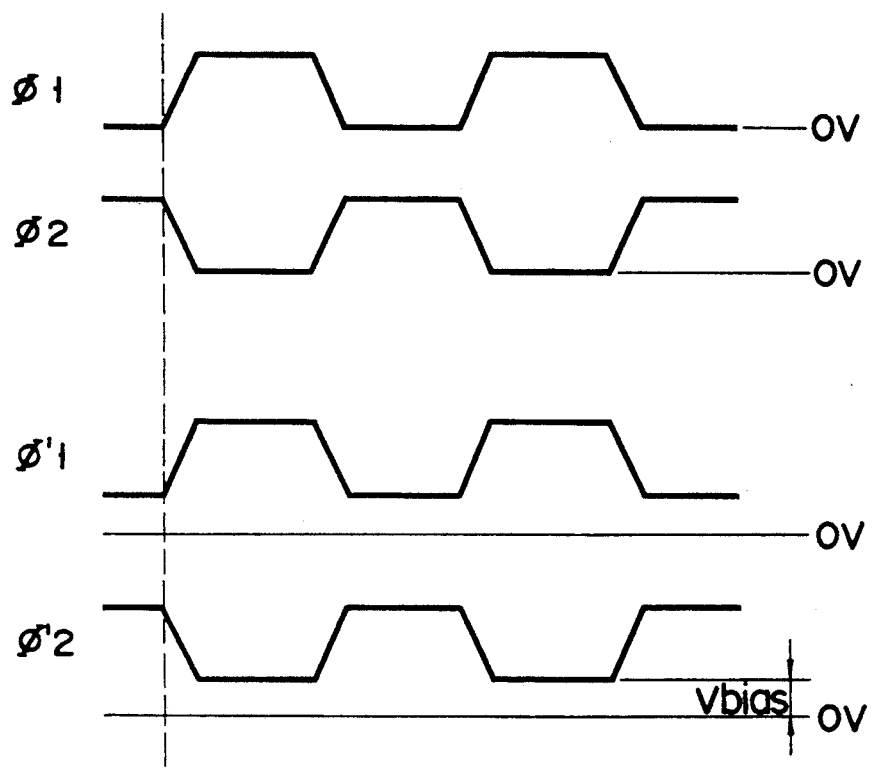
F I G. 18

(time = t1)

(time = t2)

SOLID-STATE CCD IMAGING DEVICE WITH TRANSFER GAP VOLTAGE CONTROLLER

This application is a continuation of application Ser. No. 07/660,931, filed on Feb. 26, 1991, now abandoned.

BACKGROUND OF THE INVENTION

1. Field of the Invention

The present invention relates to solid-state imaging devices and, more particularly, to a highly integrated solid-state charge-transfer type image sensor having an increased number of picture elements or "pixels" arrayed at a high density.

2. Description of the Related Art

In recent years, the number of pixels of solid-state image sensors as image input means has been increased in their high-resolution image processing performance. When the number of pixels on a substrate having a limited size is increased, each pixel is naturally micro-fabricated in size. The micro-fabrication of pixels strongly requires improvements in transfer efficiencies in horizontal and/or vertical charge transfer channel sections which transfer signal charge carriers between the pixels.

In a presently available solid-state image sensor, transfer electrodes are generally formed of a polycrystalline silicon thin film which is generally inferior in reliability, and an insulating interlayer for the electrodes is formed of a normal thermal oxide silicon layer. Therefore, if a transfer electrode is made thin and narrow in accordance with the micro-fabrication of pixels, an unwanted electric short-circuit or an undesirable potential distribution variation occurs in the transfer electrodes having poor film quality. In a charge-coupled image sensor having a single-layered transfer electrode structure, for example, a potential barrier and/or a potential pocket are/is formed in a region of charge transfer channel sections located immediately below gap sections between transfer electrodes. Such a phenomenon conspicuously reduces a transfer efficiency of signal charge carriers.

In order to solve the above problems, highly reliable new materials may be used for the transfer electrodes and the insulating interlayer. The use of such a new material, however, naturally requires a new manufacturing process. This requirement makes it difficult to manufacture image sensors and at the same time increases manufacturing cost. The difficulty in manufacture and the increase in cost are not desirable for manufacturers of semiconductors.

SUMMARY OF THE INVENTION

It is therefore an object of the present invention to provide a new and improved solid-state imaging device.

It is another object of the present invention to provide a new and improved solid-state imaging device which is highly integrated and much superior in signal charge transfer efficiency.

In accordance with the above objects, the present invention is addressed to a specific solid-state image device. This device comprises a substrate, photosensitive first semiconductive layers provided as a pixel section in the substrate, and a transfer section, provided in the substrate and coupled to the semiconductive layers, for transferring charge carriers read out from the pixel section in a predetermined direction. The transfer section has a second semiconductive layer, formed in the substrate, for defining a charge transfer channel section, and transfer electrodes insulatively provided above the substrate and arrayed in the above direction while predetermined gap sections are kept therebetween. Each of the transfer electrodes defines a charge transfer stage. The device further comprises a gap potential controller which controls the potential in layer sections of the second semiconductive layer located below the gap sections of the transfer electrodes to be set at a predetermined level intermediate between maximum and minimum potentials defined by the second semiconductive layer upon charge transfer.

The foregoing and other objects, features and advantages of the invention will become more apparent in a detailed description of preferred embodiments to be presented below.

BRIEF DESCRIPTION OF THE DRAWINGS

In the detailed description of preferred embodiments of the invention presented below, reference is made to the accompanying drawings in which:

FIG. 5 is a view showing a formation pattern of a potential well defined in a substrate at a position immediately below vertical transfer control electrodes of the image sensor shown in FIG. 1;

FIG. 6 is a view showing a formation pattern of a potential well defined in a substrate at a position immediately below the vertical transfer control electrodes of the image sensor shown in FIG. 1 in a state different from that shown in FIG. 5;

FIGS. 7A through 7G are diagrams showing sectional views of main layer structures obtained in main manufacturing steps of the image sensor;

FIGS. 8, 9, and 10 are diagrams showing sectional structures of modifications of the image sensor;

FIG. 11 is a diagram showing a sectional structure of a main part of an image sensor having a transparent transfer electrode structure according to the second embodiment of the present invention;

FIG. 13 is a diagram showing a sectional structure of a main part of an image sensor having a transparent transfer electrode structure according to the fourth embodiment of the present invention;

FIGS. 14A and 14B are views showing formation patterns of a potential well defined in a substrate at a position immediately below vertical transfer control electrodes of the image sensor shown in FIG. 13;

FIG. 18 is a diagram showing waveforms of main electrical signals generated in a main part of the embodiment shown in FIG. 6;

DETAILED DESCRIPTION OF THE PREFERRED EMBODIMENTS

Figure 1:
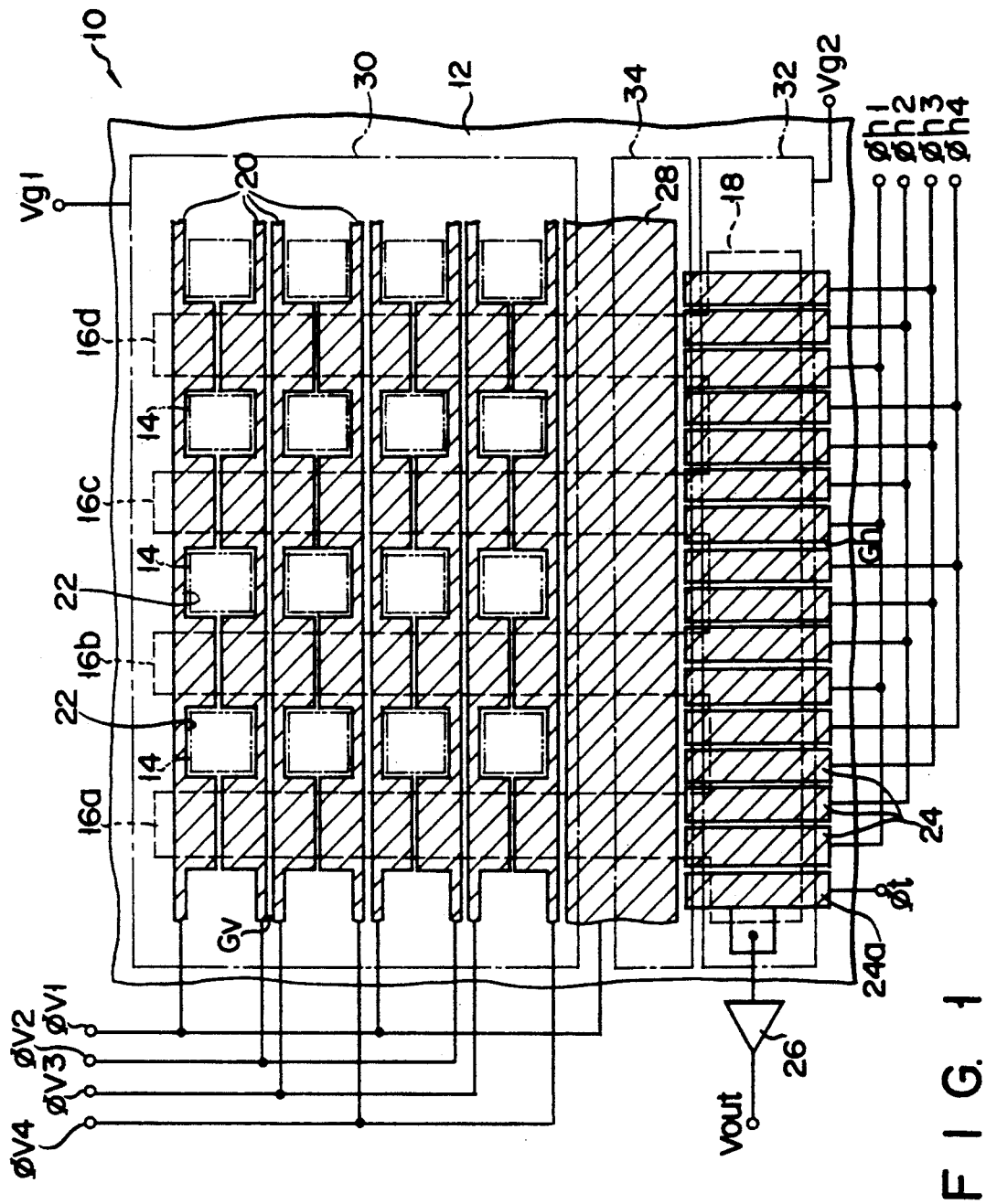
FIG. 1 is a diagram showing a planar structure of a main part of a charge-coupled image sensor according to a preferred embodiment of the present invention and its signal transmission wiring arrangement.

A charge-coupled solid-state image sensor in accordance with one preferred embodiment of the present invention is generally designated by reference numeral "10" in FIG. 1.

The CCD image sensor 10 has a silicon substrate 12 having P-type conductivity. Photodiodes 14 sensitive to incident image light are arranged on the substrate 12 in the row and column directions with predetermined intervals therebetween, thereby defining a planar matrix arrangement. The photodiodes 14 are formed by using a conventional impurity doping technique such as an impurity diffusion technique. The photodiodes 14 perform photoelectric conversion to generate signal charge carriers corresponding to the intensity of incident light and store the carriers therein. Each photodiode 14ij (i=0, 1, 2, ... ; j=0, 1, 2, ...) serves as one picture element or "pixel" of the CCD image sensor 10. On the substrate 12, therefore, a two-dimensional pixel arrangement in which selected numbers of pixels are arrayed in the row and column directions is formed.

As shown in FIG. 1, parallel semiconductor diffusion layers 16a, 16b, 16c, 16d, ... extending in the column direction are provided between neighboring column pixel arrays of the planar pixel arrangement (pixel matrix arrangement) on the substrate 12. These layers 16 serve as vertical CCD charge transfer channel sections.

The vertical charge transfer channel sections 16 are coupled together with an N-type diffusion layer 18 extending in the row direction at their end portions on one side, thereby defining a comb-teeth shape as a whole. The layer 18 serves as a horizontal CCD charge transfer channel section of the CCD image sensor 10.

A plurality of parallel polycrystalline silicon layers 20 extending in the row direction are insulatively arranged above a formation region of the vertical transfer sections 16 on the substrate 12. The parallel polycrystalline silicon layers 20 are electrically isolated from each other by small gaps Gv defined therebetween (to be illustrated in detail in FIG. 2). Each pair of neighboring layers 20 have rectangular pixel openings 22 opposite to each other in corresponding pixel positions. These layers 20 with the pixel openings 22 can be easily formed from a single polycrystalline silicon thin film by using a known patterning method. The layers 20 are connected to vertical transfer control signal input terminals Φv1, Φv2, Φv3, and Φv4, as shown in FIG. 1, and serve as vertical charge transfer control electrodes of the CCD image sensor 10.

A series of a selected number of conductive layers 24 are insulatively provided above the horizontal charge transfer channel section 18. The layers 24 are arrayed in the row direction of the CCD image sensor, i.e., the horizontal direction while small gaps Gh are kept therebetween. The series of layers 24 can be easily formed from a single polycrystalline silicon thin film by using a known patterning method. The layers 24 except for a layer 24a in the final stage are connected to horizontal transfer control signal input terminals Φh1, Φh2, Φh3, and Φh4 and serve as horizontal charge transfer control electrodes of the CCD image sensor 10. The final layer 24a is connected to an exclusive gate signal input terminal Φt to provide a final gate structure. Signal charge carriers output from the final end portion of the horizontal transfer layer 18 are externally transmitted from a signal output terminal Vout via a known signal amplifier 26.

A conductive layer 28 serving as a vertical gate electrode lies in a region between the vertical charge transfer control electrodes 20 and the horizontal charge transfer control electrodes 24. This vertical gate electrode layer is associated with one of the vertical transfer control signal input terminals Φv1, Φv2, Φv3, and Φv4, e.g., the terminal Φv1.

Signal charge carriers generated by a pixel array of each column are sequentially transferred in a corresponding vertical transfer section 16i (i=a, b, c, d, ...) in response to vertical transfer control signals Φv1, Φv2, Φv3, and Φv4. Subsequently, the signal charge carriers vertically transferred in all the pixel column arrays are sequentially transferred in the horizontal transfer layer 18 in response to horizontal transfer control signals Φh1, Φh2, Φh3, and Φh4 and finally supplied to the output terminal Vout. Such an interline transfer technique of signal charge carriers is known well to experts in this technical field.

A first metal thin film layer (typically, an aluminum thin film) 30 is insulatively disposed above the vertical transfer control electrodes 20 to cover the layers 20 except for a formation region of the pixel photodiodes 14. This thin film layer 30 is electrically connected to a terminal Vg1. The terminal Vg1 receives a DC voltage control signal (to be referred to as a "first gap potential control signal" hereinafter) Vg1 for controlling the potential of the thin film layer 30 to adjust the potential in the small gap Gv between the vertical transfer control electrodes 20 to be a desired level. The thin film layer 30 will be referred to as a "first gap potential control electrode" hereinafter.

A second metal thin film layer (typically, an aluminum thin film layer) 32 is insulatively disposed above the horizontal transfer control electrodes 24 to cover substantially the entire surfaces of the layers 24. This thin film layer 32 is electrically connected to a terminal Vg2. This terminal Vg2 receives a control signal (to be referred to as a "second gap potential control signal" hereinafter) Vg2 for controlling the potential of the thin film layer 32 to adjust the potential in the small gap Gh between the horizontal transfer control electrodes 24 to be a desired level. The layer 24 will be referred to as a "second gap potential control electrode" hereinafter.

A third metal thin film layer (typically, an aluminum thin film layer) 34 is arranged above the substrate 12 in a region between the first and second gap potential control electrode layers 30 and 32 and insulatively disposed above the vertical gate electrode 28. This layer 34 serves as a "third gap potential control electrode" for adjusting the potential in a region corresponding to the gate section of the vertical charge transfer channel section 16 located below the layer 34 to be a desired level. The first, second, and third gap potential control electrodes 30, 32, and 34 also serve as light-shielding layers of the CCD image sensor 10.

Figure 2:
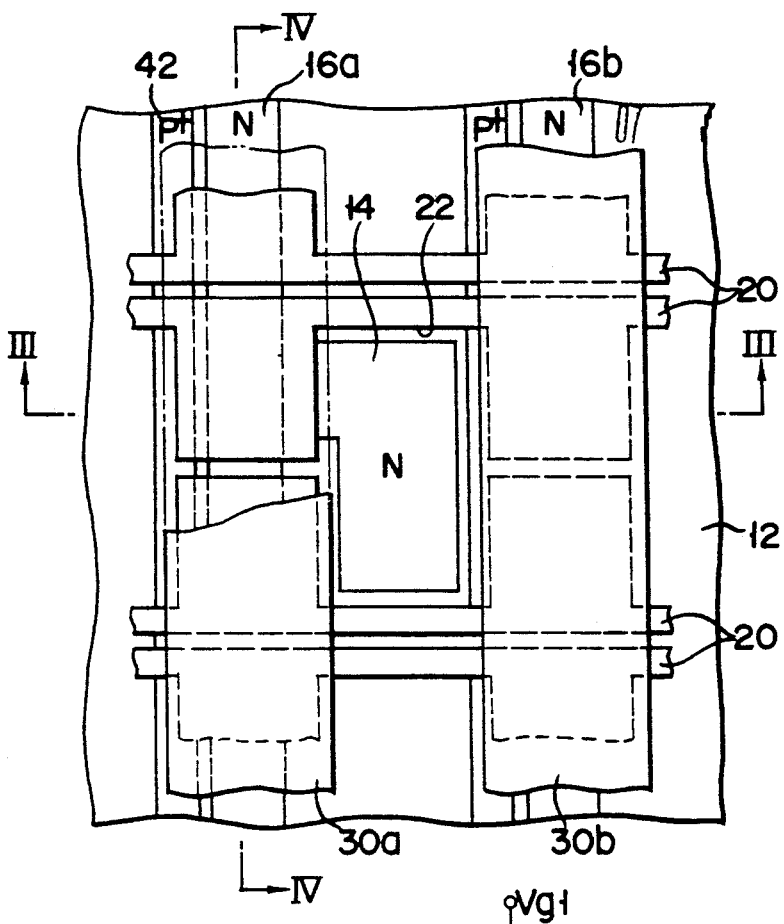
FIG. 2 is a partial plan view showing a typical part of the charge-coupled image sensor shown in FIG. 1.
Figure 3:
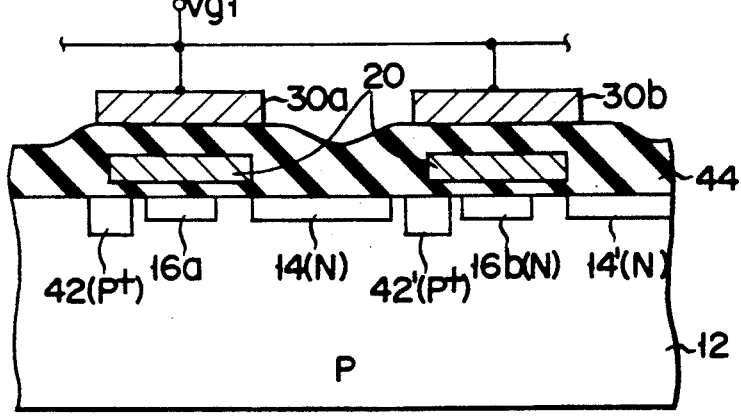
FIG. 3 is a diagram showing a sectional structure taken along a broken line III—III of the part of the image sensor shown in FIG. 2.
Figure 4:
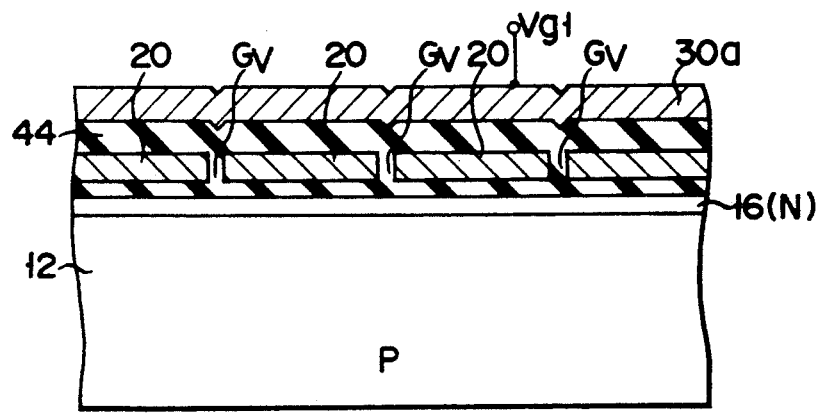
FIG. 4 is a diagram showing a sectional structure taken along a broken line IV—IV of the part of the image sensor shown in FIG. 2.

As shown in detail in FIG. 2, the first gap potential control electrode 30 has elongated conductive layers 30a, 30b, . . . formed above the vertical transfer control electrodes 20. Each pixel photodiode section has an N-type layer 14 formed on the top surface of the substrate 12. The N-type diffusion layer 14 has a planar shape corresponding to the rectangular shape of the pixel opening 22 of the two neighboring vertical transfer control electrodes 20. As shown in FIG. 3, a stripe-shaped heavily-doped P-type diffusion layer 42 is provided in substrate regions on one side of the N-type layer 14. The layer 42 serves as a channel stopper of the vertical charge transfer channel section 16. As shown in FIG. 3 or 4, the first gap potential control electrodes 30a, 30b, . . . are electrically insulated from the underlying vertical transfer control electrodes 20 by an insulating layer 44 deposited on the top surface of the substrate 12. As is apparent from FIG. 4, each gap potential control electrode 30 covers the gaps Gv between the vertical transfer control electrodes 20.

The terminal voltage Vg1 of the first gap potential control electrodes 30 is specifically arranged to steadily have a potential level which causes a substrate internal potential $\Phi g$ in a region located immediately below the small gaps Gv between the vertical transfer control electrodes 20 in the substrate 12 to be a potential intermediate between a "High" level potential $\Phi H$ and a "Low" level potential $\Phi L$ of the vertical transfer channel section.

When the voltage Vg1 set in accordance with the above principle is applied to the first gap potential control electrode 30, a "potential well" is defined in the substrate 12 at a position immediately below the vertical transfer control electrodes 20 and sequentially transfers signal charge carriers, as illustrated by a model in FIG. 5. This illustration of the potential well is made in accordance with the customs in this field of art, i.e., the voltage potential and therefore the depth of the potential well are increased in a lower position. The signal charge carriers are illustrated as if they were a liquid.

In the interline transfer type CCD image sensor 10 having the above arrangement, basic vertical and horizontal transfer of signal charge carriers is essentially performed by a known technique presently performed in this technical field by using multiphase transfer clock signals $\Phi v$ and $\Phi h$. In the vertical transfer of signal charge carriers performed in response to, e.g., four-phase clock signals applied to the terminals $\Phi v1$, $\Phi v2$, $\Phi v3$, and $\Phi v4$ (see FIG. 1) of the vertical transfer control electrodes 20, signal charge carriers 50 are "stored" at a certain moment in a potential well 52 formed immediately blow a second layer 20-2 of the vertical transfer control electrodes 20, as shown in FIG. 5. Upon application of the gap potential control voltage Vg1, a substrate potential $\Phi g0$ immediately below an interelectrode gap Gv (a gap between electrodes 20-3 and 20-4 in FIG. 5) not receiving a transfer potential is set at a potential level intermediate between the "High" level potential $\Phi H$ and the "Low" level potential $\Phi L$ of the vertical transfer channel section, as described above.

It is important that although the same voltage is applied to each gap Gv, a gap potential $\Phi g$ of a gap sandwiched between the transfer control electrodes 20 currently receiving the transfer clock voltage is lower than a standard gap potential $\Phi g0$. Referring to FIG. 5, for example, the signal charge packet 50 is stored in the potential well 52 immediately below the vertical transfer control electrode 20-2, and the neighboring vertical transfer control electrode 20-3 applies a high transfer clock voltage $\Phi v$, thereby forming a deeper potential well 54. In this case, a gap potential $\Phi g2$ in front of (in a charge outflow portion of) the potential well 52 is slightly lower than the standard gap potential $\Phi g0$, and a gap potential $\Phi g1$ at the back of (in a charge inflow portion of) the potential well 52 is lower than the potential $\Phi g2$. In other words, a potential barrier in the gap section in front of the potential well 52 is lower than that after the well. This variation in gap potential is caused by a small size of the gap Gv and is generally known as a "two-dimensional effect". This difference between the potential barriers before and after the well allows the signal charge packet 50 to smoothly flow from the potential well 52 to the potential well 54, thereby improving a transfer efficiency. In other words, a problem of degradation in transfer efficiency which is caused by formation of a potential barrier and/or a potential pocket in the gap sections between the transfer electrodes and cannot be solved by conventional CCD image sensors can be significantly solved by only adding the gap potential control electrodes 30, 32, and/or 34 without complicatedly modifying the basic structure of the CCD image sensor.

FIG. 6 shows, in correspondence with FIG. 5, a formation state of potential wells obtained when the first gap potential control voltage Vg1 is not applied in the same situation as in FIG. 5. In this case, as shown in FIG. 6, all of gap potentials are simply set at a potential $\Phi g'$ higher than the "High" level voltage $\Phi H$. As a result, very deep "gap potential wells" 56 are unconditionally formed between every two neighboring potential wells. This continuous presence of the deep gap potential wells is a bad factor: it generates unintentional "residual charge carriers" 58 during transfer of the signal charge packet 50. This naturally degrades the transfer efficiency of the signal charge carriers. A comparison between the above two cases is believed to explain the effect of supply of the gap potential control voltage Vg1 more clearly.

A principle of setting the potential of the terminal voltage Vg2 of the second gap potential control electrode 32 is essentially the same as that of the first gap potential control voltage Vg2 described above. Note that the second gap potential control voltage Vg2 is actually different in potential value from the first gap potential control voltage Vg1. The gap potential control voltage Vg2 is different from the voltage Vg1 in accordance with a difference in pulse potentials used between the transfer clock signal $\Phi v$ for the vertical CCD charge transfer channel section 16 and the transfer clock signal Φh for the horizontal CCD charge transfer channel section 18.

More specifically, as shown in FIG. 3, in the vertical charge transfer section, the vertical transfer control electrode 20 essentially covers a substrate portion between the underlying vertical CCD charge transfer channel section 16a (or 16b) and the pixel photodiode 14 associated therewith and therefore also serves as a field shift gate for reading out signal charge carriers from each pixel photodiode 14 to the vertical CCD charge transfer channel section 16. In order to prevent the signal charge carriers read out from the pixel photodiode 14 to the vertical CCD charge transfer channel section 16 from reversely flowing into the pixel photodiode 14, negative transfer clock pulse signals within the range of −8 volts to 0 volts are generally used. In the horizontal charge transfer section 18, however, positive transfer clock pulse signals within the range of 0 volts to 5 volts are used. In this state, in order to actually set the voltage Vg1 of the gap potential control voltage Vg2 at a potential level intermediate between the "High" level voltage ΦH and the "Low" level voltage ΦL in accordance with the principle described above, the following set condition must be satisfied:

$$Vg1 < Vg2$$

Figure 7A:
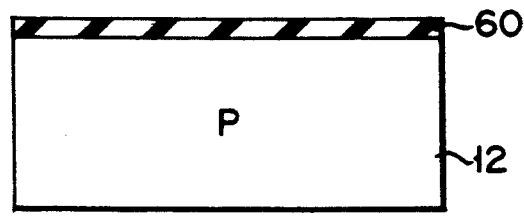
Figure 7B:
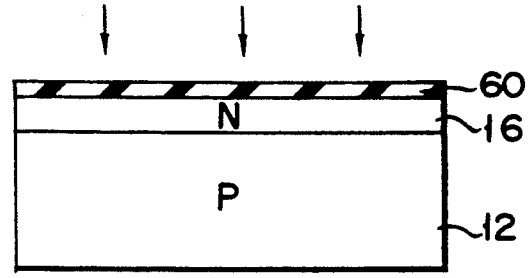

The above embodiment is manufactured in accordance with a manufacturing process to be described below with reference to FIGS. 7A through 7G. First, as shown in FIG. 7A, after an element isolation region (not shown) is formed on a P-type silicon substrate 12, a gate oxide film 60 is deposited on the substrate 12 by using a thermal oxidation technique. Subsequently, as shown in FIG. 7B, phosphorus as an impurity is doped in the top surface of the substrate 12 through the gate oxide film 60 by using an ion-implantation technique. As a result, a vertical CCD charge transfer channel layer 16 buried in the surface of the substrate 12 is formed.

Figure 7C:
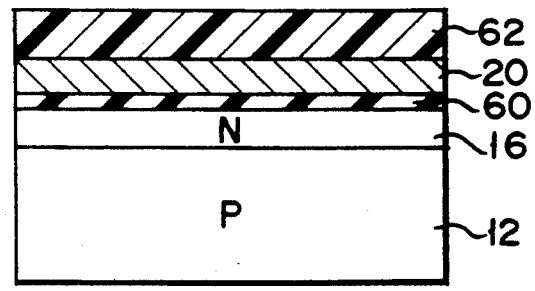

Subsequently, as shown in FIG. 7C, a polycrystalline silicon thin film layer 20 is deposited on the gate oxide film 60 by using a conventional CVD method. A photoresist layer 62 is deposited on the polycrystalline silicon thin film layer 20. The photoresist layer 62 is subjected to patterning to have a planar pattern corresponding to the planar pattern of the vertical transfer control electrodes shown in FIG. 1 or 2.

Figure 7D:
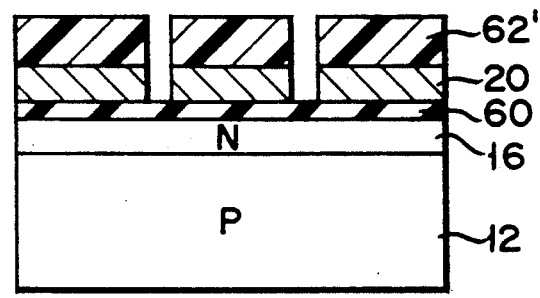

Subsequently, as shown in FIG. 7D, the underlying polycrystalline silicon layer 20 is selectively etched by using the patterned photoresist layer 62 as a mask. Also in this case, a conventional selective etching technique can be applied. After the selective etching is completed, the photoresist layer 62 is removed to obtain vertical transfer control electrodes 20, as shown in FIG. 7E.

Thereafter, as shown in FIG. 7F, an insulating layer 44 is deposited on the entire top surface of the resultant structure so as to bury the vertical transfer control electrodes 20. A metal layer 30 consisting of, e.g., aluminum is deposited on the insulating layer 44. The metal layer 30 is subjected to patterning to form parallel stripe-shaped layer sections 30a, 30b, . . . as shown in FIG. 2 and serving as the gap potential control electrodes. The manufacture of a second gap potential control electrode 32 is essentially the same as described above.

The sectional structure of the first gap potential control electrodes 30 described above can be variously modified in accordance with the thickness of the underlying vertical transfer control electrode layers 20 and a gap Gv therebetween. Typical examples of possible modifications will be described below with reference to FIGS. 8 to 10. In the following modifications, in order to avoid a redundant description, the same reference numerals as in the above embodiment denote the same parts and a detailed description thereof will be omitted.

Figure 8:
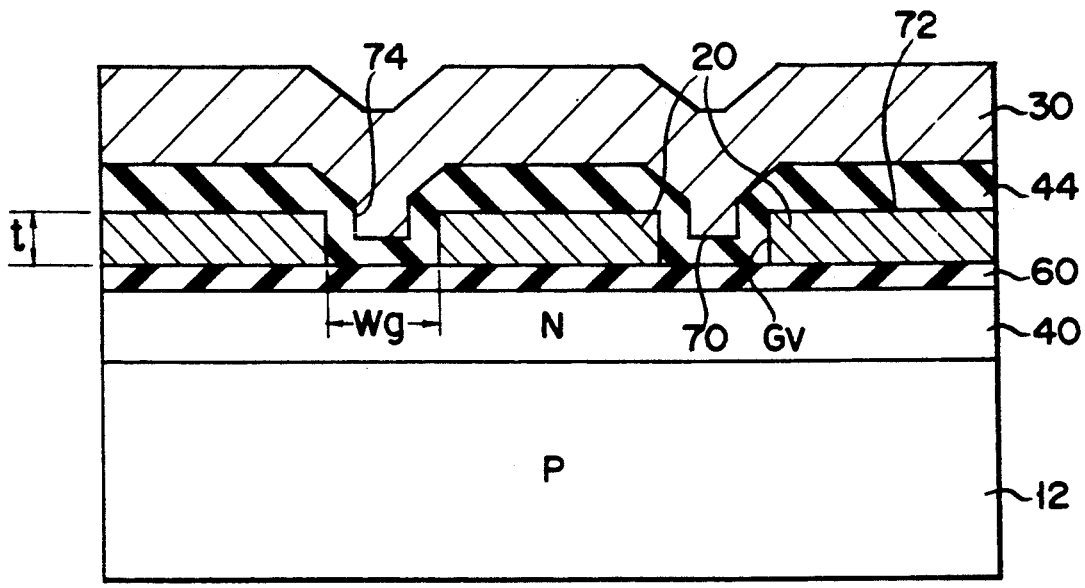

FIG. 8 shows each of the vertical transfer control electrodes 20 which is relatively small in thickness t and large in gap width Wg. Since the gap width Wg is large, the "two-dimensional effect" described above is not so significant. In this case, therefore, the gap potential control electrode 30 is preferably arranged such that its bottom surface 70 in gap sections Gv is set lower than a top surface 72 of each vertical transfer control electrode 20. More specifically, the insulating interlayer 44 has recess portions 74 in the gap sections Gv. The gap potential control electrode 30 provided on the insulating interlayer 44 is formed to bury the recess portions 74.

Figure 9:
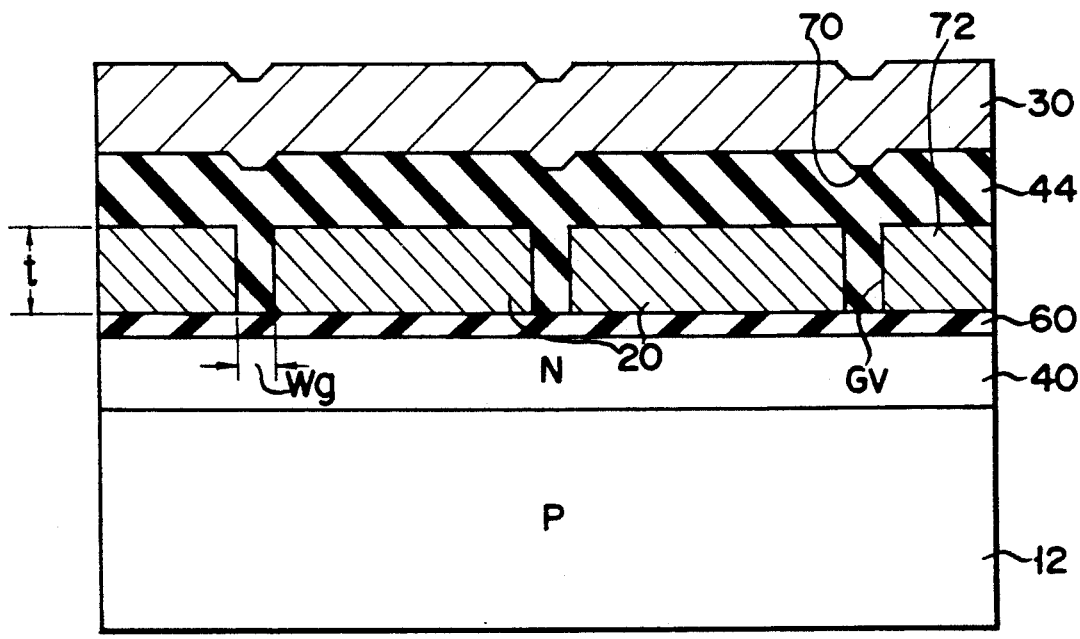

FIG. 9 shows each of the vertical transfer control electrodes 20 which is relatively large thickness t and small in gap width Wg. Since the gap width Wg is small, the above-mentioned "two-dimensional effect" is significant. In this case, therefore, the bottom surface 70 of the gap potential control electrode 30 in positions corresponding to the gap sections Gv is allowed to be set higher than the top surface 72 of the vertical transfer control electrodes 20.

According to a modification shown in FIG. 10, vertical transfer control electrodes 20' are arranged to have a trapezoidal section. Each gap section Gv has an inverted trapezoidal section in which an upper opening is wider than a bottom surface. In this case, therefore, the gap potential control electrode 30 is arranged such that its bottom surface 70 in gap sections Gv is set lower than the top surface 72 of each vertical transfer control electrode 20.

FIG. 11 shows an arrangement in which the above potential control electrode structure of the present invention is applied to an image sensor of another type having transparent charge transfer electrodes, as the second embodiment of the present invention. Referring to FIG. 11, the same reference numerals as in the above embodiment denote the same parts.

Transfer electrodes 80 are arranged on a CVD gate insulating film 60 while gap sections Gv having a predetermined width are kept therebetween in the same manner as in the above embodiment. Note that the transfer electrodes 80 consist of a transparent conductive substance, e.g., an indium-titanium-oxide (ITO). These transparent transfer electrodes 80 also serve as a photoelectric converting section having blue sensitivity. The transparent transfer electrodes 80 are buried in an insulating layer 44 as in the above embodiment. Gap potential control electrodes 82a, 82b, 82c, 82d, . . . are formed in the insulating layer 44 so as to be located on only surface regions immediately above the gap sections Gv. In other words, the gap potential control electrodes 82 are substantially self-aligned with the underlying transfer control electrodes 80.

Figure 12:
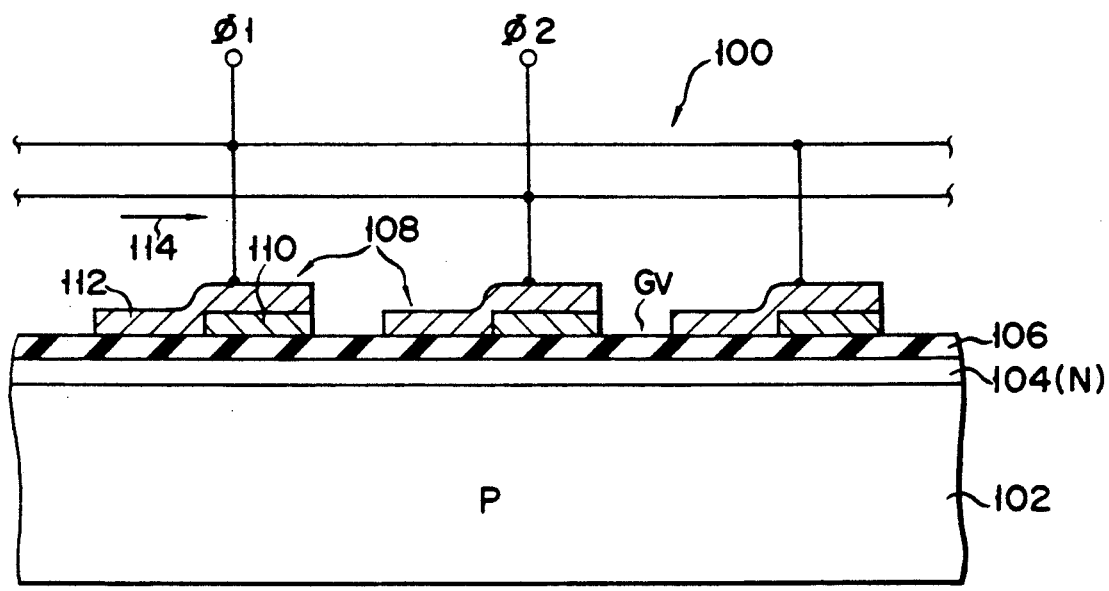
FIG. 12 is a diagram showing a sectional structure of a main part of an image sensor having a transparent transfer electrode structure according to the third embodiment of the present invention.

Referring now to FIG. 12, a two-phase transfer clock interline transfer type CCD image sensor 100 according to the third embodiment of the present invention is illustrated. The CCD image sensor has a P-type silicon substrate 102. The substrate 102 has an N-type diffusion layer 104 on its top surface portion. The diffusion layer 104 serves as a vertical and horizontal CCD charge transfer channel section. A CVD gate insulating film 106 is deposited on the substrate 102 so as to cover the diffusion layer 104.

Double-layered vtransfer control electrodes 108 are linearly arrayed while gaps Gv are kept therebetween. Each vertical transfer control electrode 108 is constituted by two types of conductive layers 110 and 112 having different work functions. The conductive layer 110 is arranged along a charge transfer direction indicated by an arrow 114 to occupy the first half of the corresponding vertical transfer control electrode 108. As shown in FIG. 12, the conductive layer 112 occupies the last half of the corresponding vertical transfer control electrode 108 along the charge transfer direction 114 and covers the top surface of the conductive layer 110. The layers 110 and 112 consist of selected metal substances, and the first transfer electrode 110 is larger in work function than the second transfer electrode 112. As a result, in each vertical transfer control electrode 108, a region of the vertical CCD charge transfer channel layer 104 immediately below the first metal electrode 110 serves as a charge storage section, and a region of the charge transfer channel layer 104 immediately below the second metal electrode 112 serves as a barrier section, i.e., an asymmetrical potential distribution is obtained.

With such an arrangement, when two-phase clock pulse signals $\Phi 1$ and $\Phi 2$ shifted from each other by 180 degrees in phase are applied to the vertical transfer control electrodes 108, signal charge carriers of each pixel photodiode (see FIG. 1 or 2) are sequentially transferred in the vertical CCD charge transfer channel section in the direction along the arrow 114. This embodiment is technically superior to the conventional devices (in which a storage section is physically formed below the vertical transfer control electrodes 108 by impurity doping) because the embodiment is free from degradation in charge transfer efficiency and/or destruction of the storage section caused by diffusion of a semiconductor impurity. In addition, since an overlap electrode structure for improving a transfer efficiency is not required unlike in conventional devices, occurrence of an internal short-circuit between electrodes can be prevented even in a micro-fabricated high-resolution image sensor, thereby improving operation reliability.

An embodiment shown in FIG. 13 is obtained by adding a gap potential control electrode 120 to the embodiment shown in FIG. 12. More specifically, a CVD insulating layer 122 is deposited on a gate insulating film 106 so as to bury double-layered transfer control electrodes 108. The gap potential control electrode 120 is formed on the CVD insulating layer 122 in substantially the same manner as in the above embodiment and applied with a control voltage Vg arranged to have a potential level which causes a substrate internal potential $\Phi g$ in a region located immediately below gaps Gv between the transfer control electrodes 108 in the substrate 102 to be a potential intermediate between a "High" level potential $\Phi H$ and a "Low" level potential $\Phi L$ of the vertical transfer channel section.

FIG. 14A shows a potential well distribution of the embodiment shown in FIG. 13 in the same manner as the potential well distribution (see FIG. 6) of the first embodiment. When signal charge carriers are transferred from a vertical transfer control electrode 108b to 108c, the electrodes 108a and 108c are applied with a clock voltage $\Phi 1$, and the electrode 108b is applied with a clock voltage $\Phi 2$. In this state, since a potential 124 in a transfer channel region immediately below a first metal electrode 110 of each vertical transfer control electrode 108 is higher than a potential 126 of a transfer channel region immediately below a corresponding metal electrode 112 due to a difference between work functions of the layers 110 and 112, a deeper potential well is defined in the channel region immediately below the first metal electrode 110. A potential 128 in a channel region immediately below the first metal electrode 110 of the vertical transfer control electrode 108c is at the "High" level potential $\Phi H$ and a potential 130 in channel region immediately below the second metal electrode 112 of the transfer electrode 108c is lower than the potential 128. A relationship between the potential levels 124, 126, 128, and 130 of the potential wells is as shown in FIG. 14A.

A potential 132 in a channel region immediately below each gap section Gv is set at an intermediate value $\Phi g$ between the potentials $\Phi H$ and $\Phi L$ because the gap potential control electrode 120 is added. Therefore, signal charge carriers 134 stored in the potential well 124 (storage section) immediately below the first layer 110 of the transfer electrode 108b "flow" into the potential well 128 (storage section) immediately below the first layer 110 of the next transfer electrode 108c beyond the gap potential section 132. When the potential well 124 of the transfer electrode 108b is perfectly set at the "Low" level potential $\Phi L$, all the signal charge carriers 134 are transferred to the next potential well storage section 128 without any remainder. As a result, the transfer efficiency of the signal charge carriers can be maximized. In a comparative example (a device having no gap potential control electrode) shown in FIG. 14B, a portion indicated by reference numeral "136" of the signal charge carriers 134 is left in a potential pocket section 138 as an undesired residual component. As a result, the transfer efficiency is decreased. The above structure is naturally applied to a horizontal transfer section of the CCD image sensor 100.

Figure 15A:
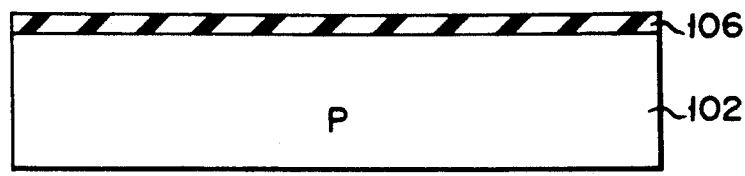
FIGS. 15A through 15G are diagrams showing sectional structures of main layer structures obtained in main manufacturing steps of the image sensor.
Figure 15B:
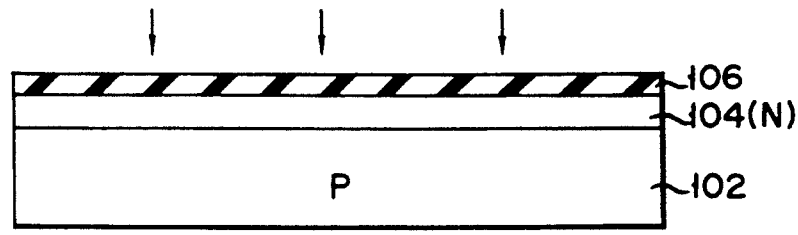

A method of manufacturing the image sensor 100 of the above embodiment will be described below. First, as shown in FIG. 15A, a P-type silicon substrate 102 is prepared. A gate insulating thin film layer 106 is deposited on the top surface of the substrate 102 by a CVD method. Subsequently, as shown in FIG. 15B, ion implantation of phosphorus is performed to form an N-type vertical CCD charge transfer channel layer 104.

Figure 15C:
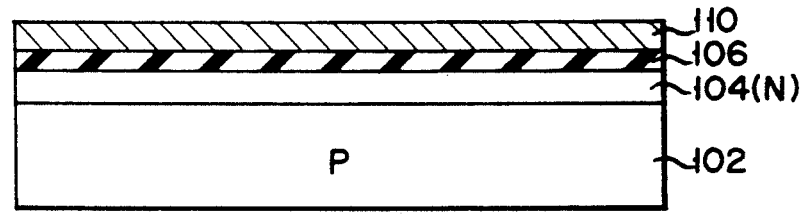
Figure 15D:
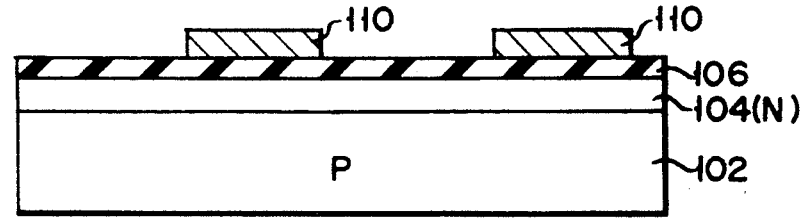
Figure 15E:
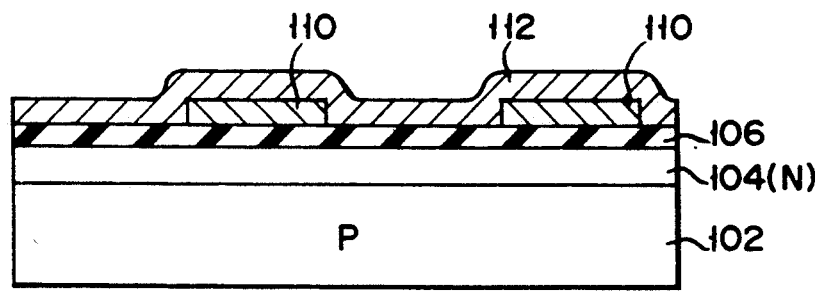
Figure 15F:
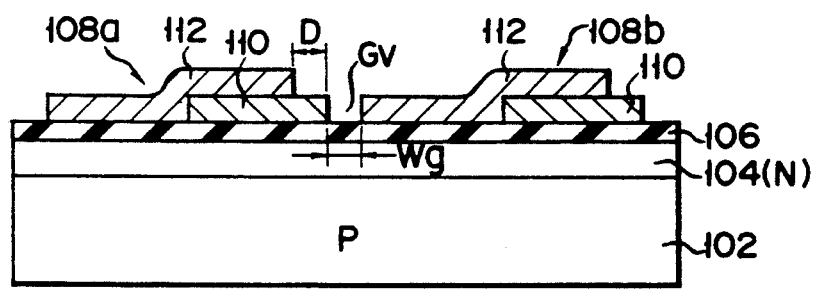

Subsequently, as shown in FIG. 15C, a first metal layer 110 is deposited on the insulating layer 106 and is then patterned. As a result, patterned layer portions as shown in FIG. 15D are obtained. Thereafter, as shown FIG. 15E, a second metal layer 112 is deposited on the insulating film 106 to cover the patterned metal layers 110 and patterned by the PFP process. As a result, second patterned layer portions as shown in FIG. 15F are obtained. In this process, a width Wg of a gap Gv between neighboring vertical transfer control electrodes 108a and 108b is determined by adjusting a patterning mask size. As shown in FIG. 15F, the end portion of the first metal layer 110 of each vertical transfer control electrode 108 may be deviated from the corresponding end portion of the second metal layer 112 by a predetermined distance D. This increases allowance margins of patterning conditions while maintaining precision of the gap width Wg, thereby contributing to an improvement in manufacture yield.

Figure 15G:
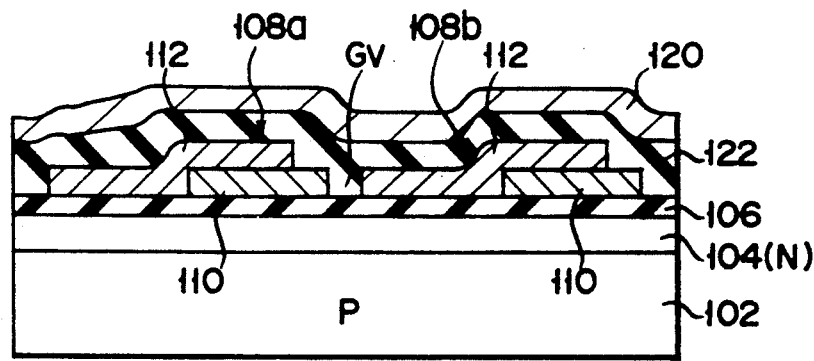

Thereafter, as shown in FIG. 15G, an insulating layer 122 is formed on the top surface of the resultant layer structure, on which a gap potential control electrode 120 is formed, thereby completing the image sensor 100.

Figure 16:
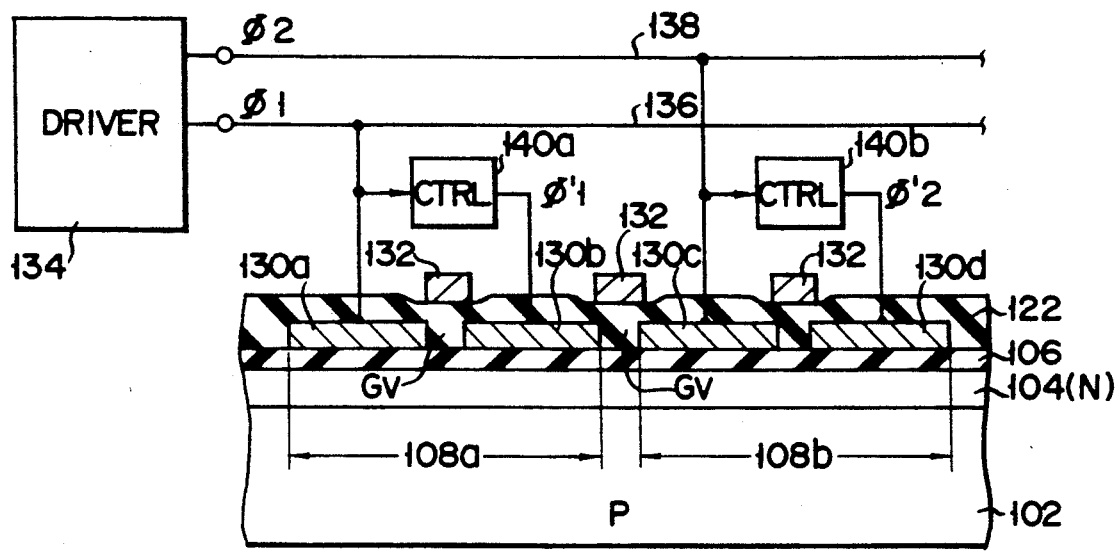
FIG. 16 is a diagram showing a sectional structure of a main part of an image sensor having a transparent transfer electrode structure according to the fifth embodiment of the present invention.

According to still another embodiment shown in FIG. 16, an asymmetrical potential distribution in each vertical transfer control electrode section is electrically realized by using an external circuit arrangement. More specifically, patterned metal layer components 130a, 130b, 130c, and 130d, . . . are arrayed on the CVD gate insulating film 106 while predetermined gaps Gv are kept therebetween. Each pair of two neighboring layers corresponds to the transfer electrode unit 108a, 108b, or 108c of the above embodiment shown in FIG. 13. These metal layer components 130 are buried in an insulating layer 122. Gap potential control electrodes 132 are provided on the insulating layer 122.

Figure 17:
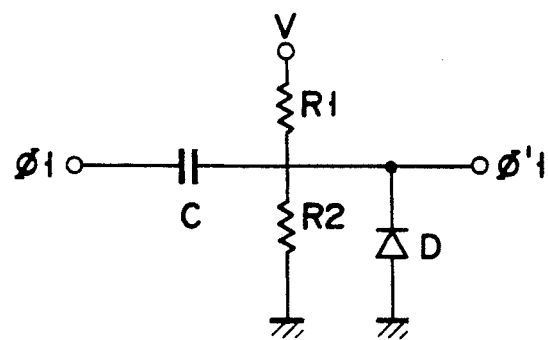
FIG. 17 is a circuit diagram showing an internal arrangement of one of voltage controllers provided in the embodiment shown in FIG. 16.

A driver 134 for generating transfer control clock pulses Φ1 and Φ2 is connected to a pair of signal transmission lines 136 and 138. The lines 136 and 138 are associated with the metal electrodes 130 in the manner as shown in FIG. 16. The line 136 is directly connected to every four electrodes 130a, 130e (not visible), . . . The line 138 is directly connected to every four electrodes 130c, 130g (not visible), . . . two stages before the electrodes 130a, 130e, . . . along the transfer direction of the electrodes 130a, 130e, . . . In each transfer control electrode unit 108a (or 108b) constituting one transfer stage, the electrode 130b (or 130d) (corresponding to the first metal electrode 110 in the embodiment shown in FIG. 12 or 13) before the unit 108a (or 108b) is connected to the electrode 130a (or 130c) after the unit 108a (or 108b) via a potential controller 140a (or 140b). As shown in FIG. 17, each controller 140 is constituted by a capacitor C, voltage-dividing resistors R1 and R2, and a clamping diode D.

The potential controller 140a of the vertical transfer control electrode section 108a receives a first transfer clock signal Φ1 as shown in FIG. 18 and biases the signal to increase the potential level of the signal by a predetermined level, thereby generating a biased clock signal Φ1'. The potential controller 140b of the next vertical transfer control electrode section 108b receives a second transfer clock signal Φ2 and biases the signal to increase the potential level of the signal by a predetermined level Vbias (see FIG. 18), thereby generating a biased clock signal Φ2'. This biasing of clock signals realizes a potential well distribution as shown in FIG. 14A in which a storage section 124 and a barrier 126 are defined in each vertical transfer control electrode section 108. In this case, a gap potential Φg shown in FIG. 14A is set as described above upon addition of gap potential control electrodes 132 to prevent generation of an undesired potential pocket between neighboring charge transfer stages, thereby improving the transfer efficiency of signal charge carriers.

Figure 19:
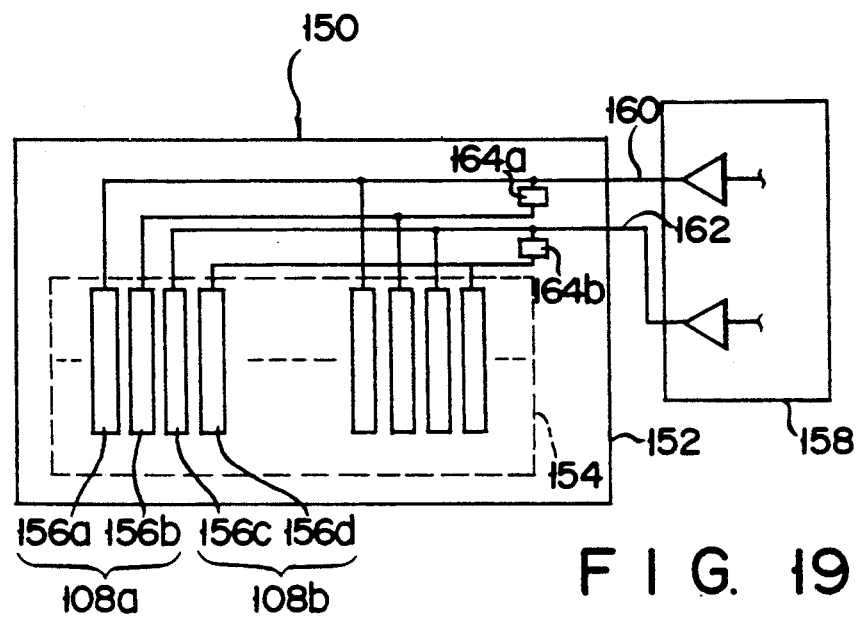
FIG. 19 is a diagram schematically showing an internal arrangement of an image sensor chip incorporating the embodiment shown in FIG. 16.

FIG. 19 shows a schematic entire arrangement of a one-chip imaging device 150 incorporating the embodiment shown in FIG. 16, in which reference numeral "152" denotes a CCD image sensor chip. The CCD image sensor chip 152 has a two-phase clock drive CCD transfer section 156 therein. The CCD transfer section 156 includes single-layered transfer electrodes 156a, 156b, 156c, 156d, . . . These single-layered transfer electrodes 156 are aligned in an array along the transfer direction. The transfer electrodes 156 correspond to the electrodes 130 of the embodiment shown in FIG. 16, and every two neighboring electrodes 156a and 156b (or 156c and 156d) constitute one transfer stage 108a (or 108b). The transfer electrodes 156 are electrically associated with an external transfer clock signal generator 158 through signal transmission lines 160 and 162. It should be noted that potential controllers 164a and 164b are mounted not outside but inside the chip 152 to minimize an adverse influence of external noise.

Figure 20:
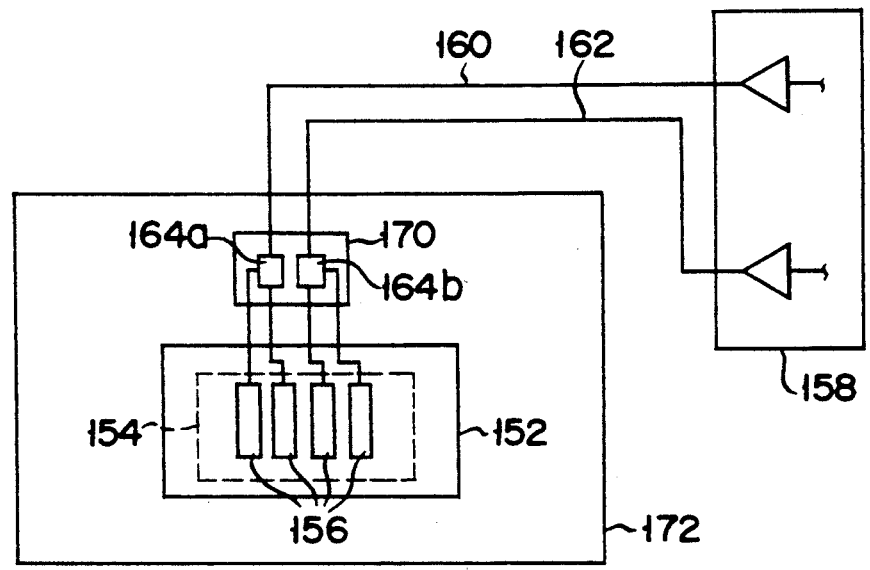
FIG. 20 is a diagram schematically showing an internal arrangement of an image sensor package body incorporating the embodiment shown in FIG. 16.

The CCD image sensor system shown in FIG. 19 may be modified as shown in FIG. 20. According to a CCD image sensor package body shown in FIG. 20, a circuit section 170 incorporating the potential controllers 164a and 164b is arranged near the CCD image sensor chip 152 on a mother board 172. This arrangement can also suppress an adverse influence of external noise.

Figure 21A:
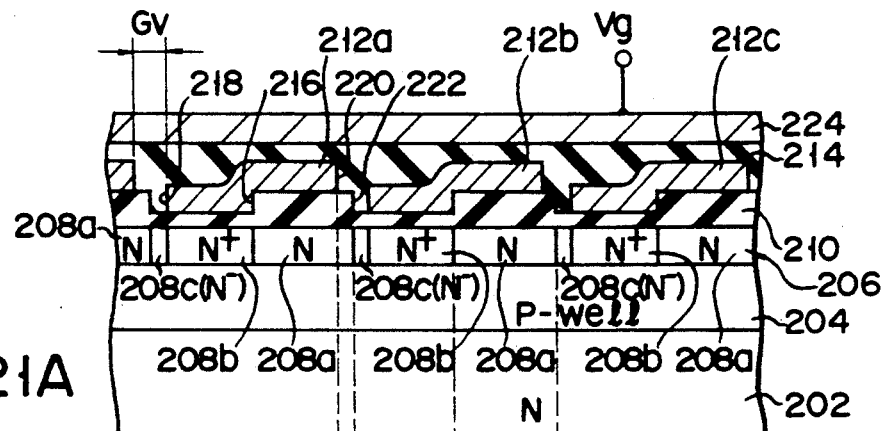
FIGS. 21A to 21C are diagrams showing a sectional structure of a main part of an image sensor according to the fifth embodiment of the present invention and typical potential well distributions generated in the structure at different timings.

An image sensor 200 shown in FIG. 21A has an N-type silicon substrate 202 having a P-type well region 204 formed on its top surface. An N-type diffusion layer 206 in which an impurity concentration is sequentially changed along the charge transfer direction is formed in the well region 204 to serve as a buried CCD charge transfer channel section. The charge transfer channel layer 206 has normal concentration layer sections 208a, high concentration layer sections 208b, and low concentration layer sections 208c. As shown in FIG. 21A, these layer sections 208a, 208b, and 208c are sequentially arranged with predetermined intervals therebetween while predetermined gaps Gv are kept between the layers.

An insulating layer 210 having a thickness which changes in correspondence with a local concentration change in the charge transfer channel layer 206 is provided on the substrate 202. The insulating layer 210 is relatively large in thickness in locations immediately above the N-type layer sections 208a of the charge transfer channel layer 206 and relatively small in thickness in locations immediately above the N+-type layer sections 208b and N−-type layer sections 208c of the layer 206. The surface configuration of the insulating layer 210 can be realized by a present level of manufacturing techniques (to be described later) with satisfactory precision.

Transfer control electrodes 212a, 212b, 212c, . . . consisting of a conductive substance such as polycrystalline silicon or a metal are provided on the uneven insulating layer 210 and buried in another insulating layer 214. Each of the transfer control electrodes 212 constitutes one transfer stage. As shown in FIG. 21A, each transfer control electrode layer 212i (i=a, b, c, . . .) is arranged across a step portion 216 of the uneven insulating layer 210. In each transfer stage, the N+-type layer sections 208b of the charge transfer channel layer 206 are self-aligned with one end 216 of the corresponding transfer electrode layer 212i positioned thereover. In this embodiment, the other end 220 of the electrode 212i terminates before another step portion 222 of the underlying uneven insulating layer 210. The N−-type layer sections 208c of the charge transfer channel layer 206 are located immediately below the gap sections Gv between every neighboring transfer stages of the corresponding transfer electrode 212i.

A gap potential control electrode 224 is provided on the top surface of the flat insulating layer 214. As in the embodiments described above, the gap potential control electrode 224 is applied with a gap control voltage Vg which causes the potential in portions of the charge transfer channel section 206 immediately below the gap section Gv between the transfer control electrodes 212, i.e., the potential in the N−-type layer sections 208c to be set at a potential intermediate between a "High"

level potential ΦH and a "Low" level potential ΦL of the charge transfer channel section.

Figure 21B:
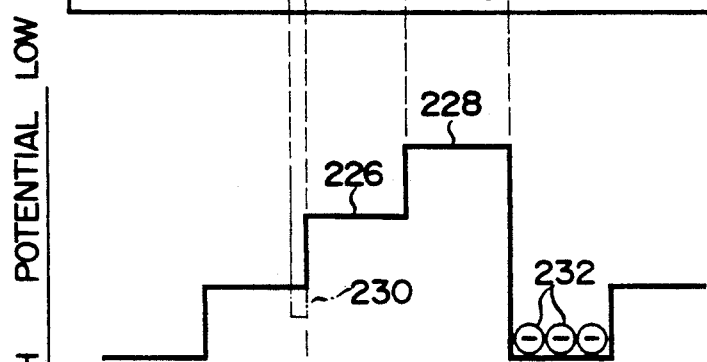
Figure 21C:
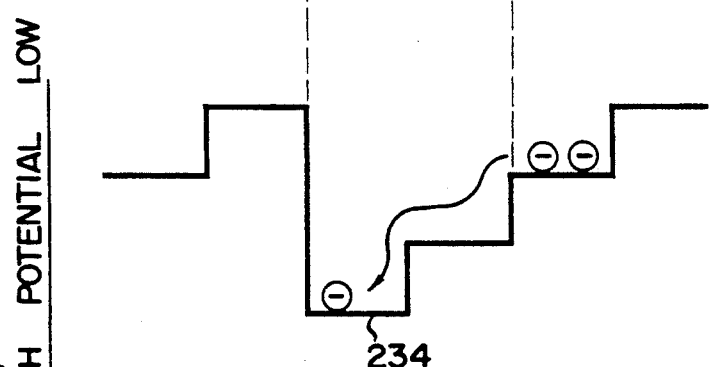

According to the image sensor 200 having the charge transfer channel section 206 with different concentration regions, when two-phase transfer clock signals Φ1 and Φ2 (square clock pulse signals having pulse signal phases shifted by 180 degrees from each other) are externally supplied, potential well distributions as shown in FIGS. 21B and 21C are generated in the substrate 202 at two typical different times t1 and t2. It should be noted that in each transfer electrode stage, a potential level 226 in a transfer channel region immediately below the N+-type layer section 208b is higher than a potential level 228 in a transfer channel region immediately below the N-type layer section 208a in the same stage. This portion is a potential well serving as a charge storage section. This increase in potential level is caused by concentration setting in the N+-type layer section 208b. Since the N−-type layer sections 208c are formed in and the gap potential control electrode 224 is added to the charge transfer channel section 206, the potential level in transfer channel regions immediately below the gap sections Gv between the transfer electrodes is lower than that of a conventional device not having the gap potential control electrode 224. As a result, a potential pocket (which generates residual charge carriers to decrease the transmission efficiency upon charge transfer) as indicated by reference numeral "230" in FIG. 21B is removed. Therefore, signal charge carriers 232 (see FIG. 21B) stored in a charge transfer channel region immediately below the high concentration layer section of the transfer electrode stage 212c at the time t1 flow into a potential well 234 (which becomes deeper upon application of a clock pulse voltage) immediately below the N+-type layer section 208b in the neighboring transfer stage 212b.

With such an arrangement, in each charge transfer electrode section 212i, the charge storage section is not defined by a transfer channel region immediately below a thick portion of the uneven insulating layer 210 but defined by a transfer channel region immediately below a thin portion of the layer 210. As a result, a charge storage capacity is improved to increase the signal charge storage amount in each charge transfer channel stage. In addition, the potential in transfer channel regions immediately below the gap section Gv between the transfer control electrodes 212 can be adjusted to be a suitable low value by controlling an impurity doping amount, thereby eliminating generation of a "potential pocket". The generation of a "potential pocket" can also be prevented by applying a properly selected control voltage Vg to the gap potential control electrode 224. Since such double potential pocket preventing means are provided, the image sensor 200 of this embodiment can be maximumly improved in charge transfer efficiency.

Figure 22A:
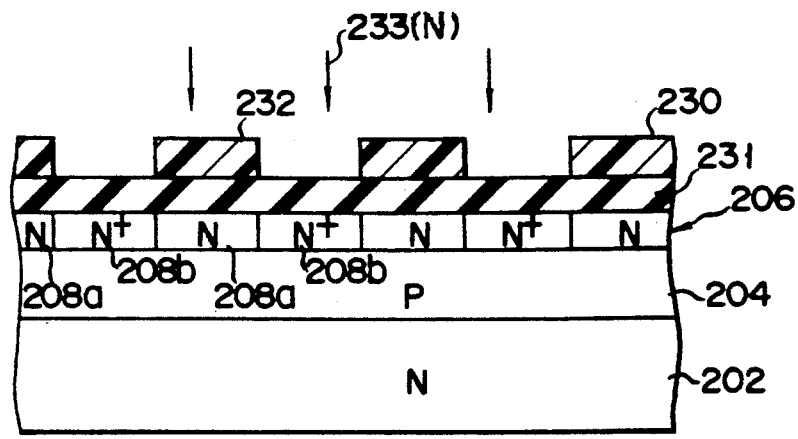
FIGS. 22A to 22D are diagrams showing sectional structures of main layer structures obtained in main manufacturing steps of the image sensor shown in FIG. 21A.

A method of manufacturing the image sensor 200 will be described below with reference to FIGS. 22A through 22D. A P-type well region 204 is formed on the top surface of an N-type silicon substrate 202 by using an impurity diffusing technique. Subsequently, a gate oxide film 231 is deposited on the top surface of the substrate 202 by using a thermal oxidation process. A photoresist layer 230 patterned to have openings 232 with predetermined intervals therebetween as shown in FIG. 22A is deposited on the gate oxide film 206. In this state, a selected N-type semiconductor impurity 233 is doped and diffused in the top surface region of the substrate 202 through the gate oxide film 231 in accordance with an ion implantation method by using the patterned photoresist layer 230 as a mask. As a result, as shown in FIG. 22A, an N-type diffusion layer 206 in which an impurity concentration locally changes is obtained on the top surface portion of the P-type well region 204. N+-type layer sections 208b are formed in the openings 232 of the patterned photoresist layer 230 since the impurity is doped in the substrate 202 through only the insulating layer 231.

Figure 22B:
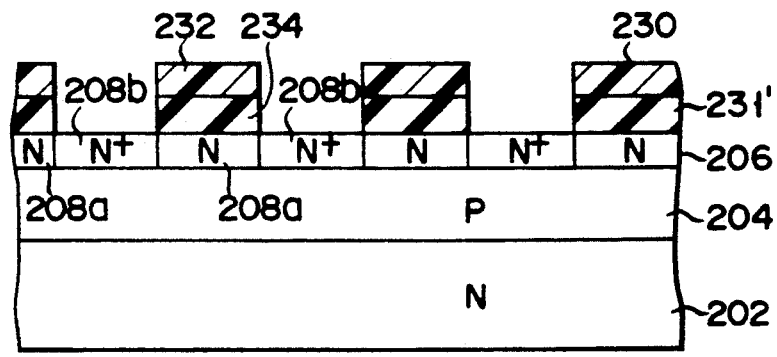

Subsequently, the underlying insulating layer 231 is subjected to selective etching by using the patterned photoresist layer 230 as a mask. As a result, as shown in FIG. 22B, the insulating layer 231 obtains openings 234 corresponding to the openings 232 in the photoresist layer 230.

Figure 22C:
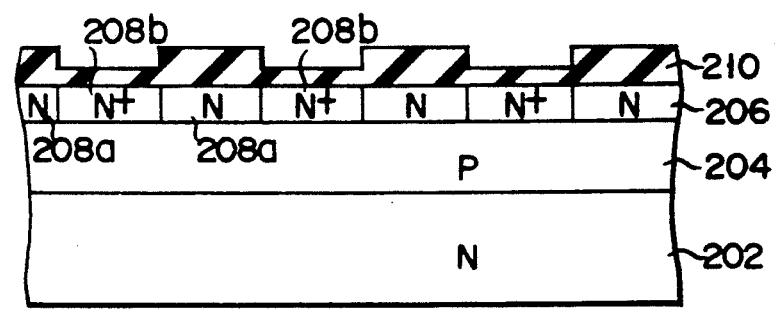

After the photoresist layer 230 is removed, a thin gate insulating film is deposited on the top surface of the resultant structure, thereby forming an uneven insulating layer 210, as shown in FIG. 22C. Thereafter, transfer control electrodes 212 are formed on the uneven insulating layer 210 by patterning a known aluminum metal deposition layer. A P-type semiconductor impurity is doped in the N-type charge transfer channel layer 206 by using the electrodes 212 as masks, thereby forming N−-type layer sections 208c in the charge transfer channel layer 206. An insulating layer 214 is so deposited as to bury the electrodes 212 therein. A gap potential control electrode 224 is formed on the insulating layer 214, thereby completing the image sensor 200.

A method of manufacturing an image sensor according to still another embodiment of the present invention will be described below with reference to FIGS. 23A to 23D. Note that the same reference numerals as in the image sensor 200 of the above embodiment denote the same parts and a detailed description thereof will be omitted.

Figure 23A:
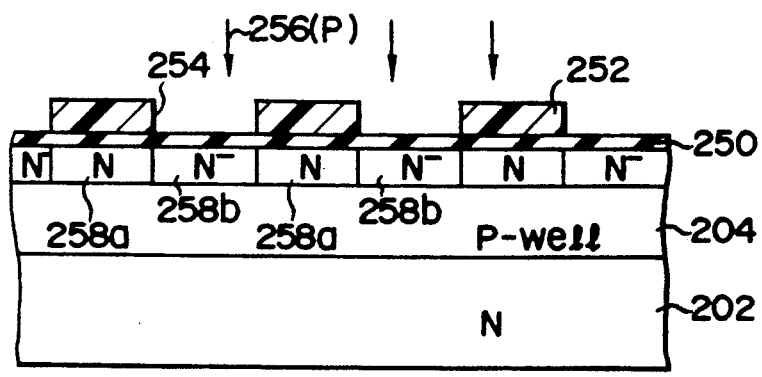
FIGS. 23A to 23D are diagrams showing sectional structures of main layer structures obtained in main manufacturing steps of an image sensor according to the sixth embodiment of the present invention.

After a P-type well region 204 is formed on the top surface portion of an N-type substrate 202, a thin SiN insulating film 250 is uniformly deposited on the N-type substrate 202, as shown in FIG. 23A. A photoresist layer 252 patterned by the same technique as shown in FIG. 22A is formed on the insulating film 250. The photoresist layer 252 is different from the photoresist layer 230 shown in FIG. 22A in that formation positions of openings 254 in FIG. 23A are in a complementary relationship with those of the openings 232 in FIG. 22A.

A P-type semiconductor impurity 256 is ion-implanted in the P-type well region 204 by using the patterned photoresist mask 252 as a mask to form normal concentration layer sections 258a and N−-type layer sections 258b alternately arrayed therein. The normal concentration layer sections 258a are located below a solid portion of the photoresist layer 252, and the N−-type layer sections 258b are substantially self-aligned with the openings 254.

Figure 23B:
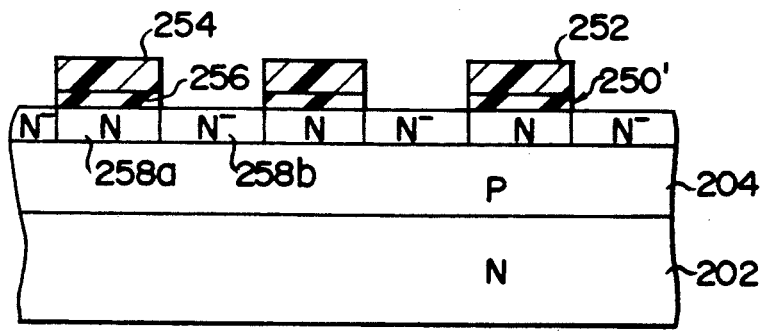

Subsequently, as shown in FIG. 23B, the underlying thin insulating layer 250 is patterned by using the patterned photoresist layer 252 as a mask again to form openings 256 substantially self-aligned with the openings 254.

Figure 23C:
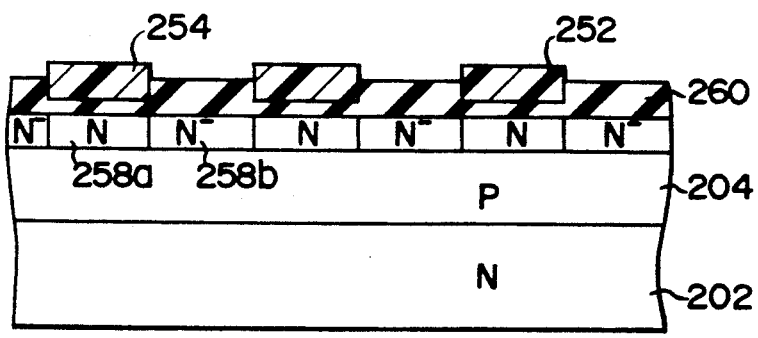
Figure 23D:
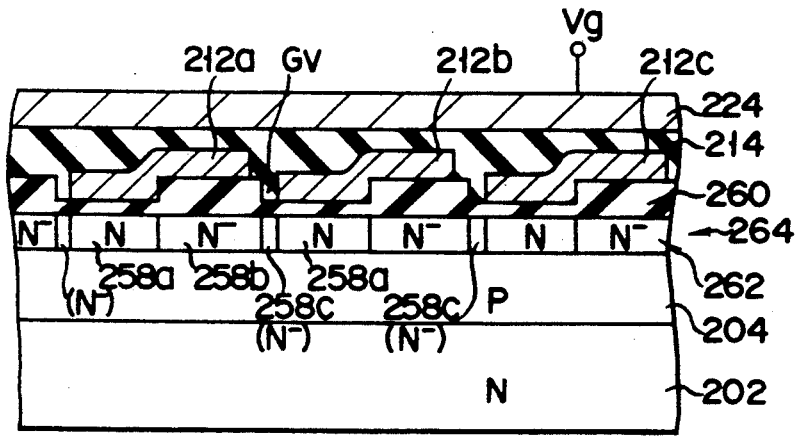

The entire top surface of the resultant structure is oxidized while the patterned photoresist layer 252 is left thereon. As a result, as shown in FIG. 23C, an insulating layer 260 having an uneven surface configuration which is locally thick in the openings 254 of the photoresist layer 252 is obtained. The patterned photoresist layer 252 is removed by etching.

Figure 22D:
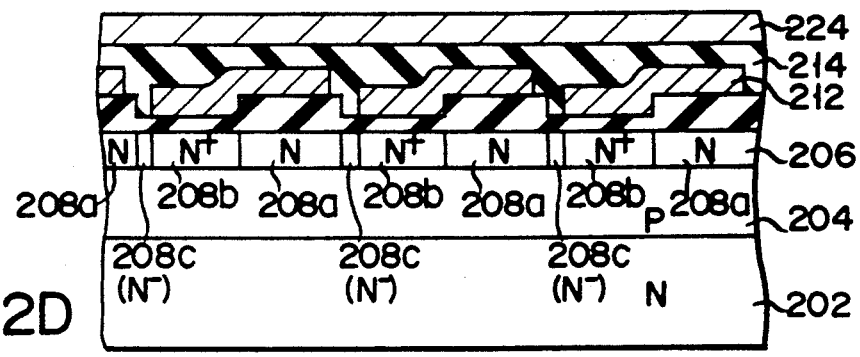

Thereafter, the transfer control electrodes 212 are formed in the same layer formation manner as shown in FIG. 22D. In this formation, the P-type impurity is ion-implanted again in the P-type well region 204 to form an N⁻-type layer section 258c between the N⁻-type layer section 258b of each transfer control electrode 212 and the N⁻-type layer section 258b of the neighboring transfer electrode 212. As is apparent from FIG. 23D, the layer section 258c is substantially self-aligned with the corresponding gap section Gv between the neighboring transfer electrodes 212. As a result, a charge transfer channel layer 262 in which the concentration changes at a predetermined period is formed in the P-type well region 204. Thereafter, the insulating layer 214 is deposited to cover transfer electrodes 212a, 212b, 212c, ..., and a gap potential control electrode 224 is formed on the insulating layer 214, thereby completing an image sensor 264.

According to the image sensor 264, unlike in the image sensor 200 described above, no N⁺-type layer sections are formed in the charge transfer channel layer 262 in which the impurity concentration periodically changes. Therefore, the image sensor 264 can provide technical merits equivalent to those obtained by the image sensor 200 and at the same time can provide additional advantage of enabling to eliminate the generation of any potential pocket in the channel section (gas section) due to the decreased n-type impurity concentration in the channel section.

What is claimed is:

1. A solid-state imaging device comprising:
   a substrate;
   photosensitive first semiconductor layers arranged in said substrate as pixel sections;
   transfer means arranged in said substrate and coupled to said pixel sections, for transferring charge carriers read out from said pixel sections in a predetermined direction;
   said transfer means including (i) a second semiconductive layer in said substrate, for defining a charge transfer channel section, and (ii) an array of spaced-apart transfer electrodes arranged in a single conductive layer insulatively disposed at a first level above said substrate and extending in said direction with gap sections between adjacent ones of said transfer electrodes, for defining a plurality of charge-transfer channel regions located below said transfer electrodes in said second semiconductive layer;
   said second semiconductive layer having gap regions located below said gap sections; and
   gap potential control means including a charge accelerating conductive layer arranged at a second level over said substrate to insulatively overlie said transfer electrodes and said gap sections among them, for receiving a DC voltage signal externally supplied thereto, and for, when the charge carriers are flowing through a certain charge-transfer channel region in said second semiconductive layer, potentially controlling said gap regions in such a manner that a front gap region is potentially greater than a rear gap region of a certain charge-transfer channel region through which the charge carriers read out from said pixel sections are set at first and second intermediate potential levels between a maximum potential and a minimum potential defined in said second semiconductive layer, thereby to accelerate the forward flow of charge carriers, wherein said charge accelerating conductive layer has an elongated layer section extending in said predetermined direction and receives a DC voltage signal externally supplied thereto.

2. The device according to claim 1, wherein said gap potential control means comprises:
   means for causing said gap sections of said second semiconductive layer to be lower in impurity concentration than the remaining regions of said second semiconductive layer.

3. The device according to claim 1, wherein said gap potential control means further comprises:
   means for causing said gap sections of said second semiconductive layer to be lower in impurity concentration than the remaining regions of said second semiconductive layer.

4. The device according to claim 1, wherein said second semiconductive layer includes some of said gap sections which are lower in impurity concentration than the others of said gap regions.

5. The device according to claim 4, wherein said second semiconductive layer has, in regions located below said transfer electrodes,
   a first subregion having an impurity concentration sufficient to form a potential well for temporarily storing transferred charge carriers therein, and
   a second subregion neighboring said first subregion and lower in impurity concentration than said first subregion.

6. The device according to claim 5, wherein specific layer sections of said second semiconductive layer are not higher than said second subregion in impurity concentration.

7. A solid-state charge transfer device comprising:
   a semiconductive substrate;
   semiconductive photosensitive layers arranged on the substrate to define an array of rows and columns of pixels, for generating signal charge carriers representing an incident image;
   a plurality of first semiconductive charge transfer channel layers extending in a first direction in said substrate, each of the first channel layers being close to a corresponding one of the columns of pixels;
   first electrode means overlying said first channel layers with gaps between adjacent ones of said first electrode means along the first direction, for sequentially transferring signal charge carriers toward output stages of said first channel layers in response to a first clock signal, said first electrode means including an array of first transfer electrodes arranged in a single conductive layer above said substrate;
   a second semiconductive charge transfer channel layer extending in a second direction in said substrate to be coupled to the output stages of said first channel layers, and having an output;
   second electrode means overlying the second channel layer with gaps between adjacent ones of said second electrode means along the second direction, for causing signal charge carriers sent from said first channel layers to sequentially transfer towards the output of said second channel layer in response to a second clock signal, said second electrode means including an array of second transfer electrodes arranged in a single conductive layer above said substrate;

amplifier means coupled to said output of said second channel layer, for amplifying and externally outputting signal charge carriers transferred thereto; and gap-potential controller means associated with at least one of the first and second electrode means, for adjusting a potential in certain adjacent channel regions located below the gaps of a channel layer or layers associated with said at least one electrode means to be set at intermediate levels between "high" and "low" level potentials of said channel layer or layers, said intermediate levels being potentially different from each other so as to enhance the flow of signal charge carriers, said gap-controller means comprising a charge accelerating conductive layer at least partially overlying at least one of said first and second electrode means and providing the intermediate levels in response to a DC voltage signal externally supplied thereto.

8. The device according to claim 7, wherein said substrate has an impurity-doped region having a conductivity type opposite to that of said substrate in a surface portion thereof.

9. The device according to claim 8, wherein said gap potential controller means comprises:

a conductive layer, insulatively provided above said substrate, for receiving a DC voltage signal having a predetermined potential and externally supplied thereto as a gap potential control signal.

10. The device according to claim 9, wherein said conductive layer at least partially overlies said gaps of said first electrode means.

11. The device according to claim 9, wherein said conductive layer at least partially overlies said gaps of said second electrode means.

12. The device according to claim 9, wherein said conductive layer at least partially covers said gaps of said first and second electrode means.

13. The device according to claim 9, wherein said conductive layer covers said first and second electrode means.

14. The device according to claim 9, wherein said conductive layer entirely covers both of said first and second electrode means.

15. The device according to claim 9, wherein at least one of said first and second channel layers is periodically varied in impurity concentration, so that specific regions thereof immediately below said gaps are potentially lower than the remaining regions.

16. The device according to claim 9, wherein at least one of said first and second electrode means has a multi-layered structure at least in part.

17. The device according to claim 9, further comprising:

a dielectric layer arranged between at least one of said first and second electrode means and said substrate and at least partially varied in thickness to exhibit an uneven surface having a step, said at least one of said first and second electrode means being arranged across said step.

18. The device according to claim 9, wherein at least one of said first and second electrode means has, in each transfer stage thereof, (i) first and second subelectrode layers being electrically insulated from each other, and (ii) bias means, connected between said first and second subelectrode layers, for generating a potential difference therebetween so that said second subelectrode layer is set at a potential greater than that of said first subelectrode layer.

19. The device according to claim 18, wherein said bias means includes voltage-dividing resistive elements and a diode associated therewith.

20. The device according to claim 19, wherein said bias means is arranged on said substrate.

21. The device according to claim 19, wherein said bias means is arranged close to said substrate.

22. A solid-state imaging device comprising:

a substrate;

photosensitive first semiconductor layers arranged as pixel sections;

transfer means arranged in said substrate and coupled to said pixel sections, for transferring charge carriers read out from said pixel sections in a predetermined direction;

said transfer means including (i) a second semiconductive layer in said substrate, for defining a charge transfer channel section, and (ii) an array of spaced-apart transfer electrodes arranged in a single conductive layer insulatively disposed at a first level above said substrate and extending in said direction with gap sections between adjacent ones of said transfer electrodes, for defining a plurality of charge-transfer channel regions located below said transfer electrodes in said second semiconductive layer;

said second semiconductive layer having gap regions located below said gap sections; and gap potential control means including a charge accelerating conductive layer arranged at a second level over said substrate to insulatively overlie said transfer electrodes and said gap sections among them, for receiving a DC voltage signal externally supplied thereto, and for, when the charge carriers are flowing through a certain charge-transfer channel region in said second semiconductive layer, potentially controlling said gap regions in such a manner that a front gap region is potentially greater than a rear gap region of a certain charge-transfer channel region through which the charge carriers read out from said pixel sections are presently flowing are set at first and second intermediate potential levels between a maximum potential and a minimum potential defined in said second semiconductive layer, thereby to accelerate the forward flow of charge carriers, wherein said charge accelerating conductive layer has an elongated layer section extending in said predetermined direction.

* * * * *